US007811153B1

(12) United States Patent
Blank et al.

(10) Patent No.: US 7,811,153 B1
(45) Date of Patent: Oct. 12, 2010

(54) HIGH THROUGHPUT SERVO LOAD CUP WITH INTEGRATED WET CHEMISTRY DELIVERY

(75) Inventors: Rich Blank, San Jose, CA (US); Peter Thaulad, San Jose, CA (US); Wayne Tang, Union City, CA (US); Kevin Bertsch, Tigard, OR (US); Paul Franzen, West Linn, OR (US); Ken Reynolds, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 768 days.

(21) Appl. No.: 11/731,737

(22) Filed: Mar. 30, 2007

(51) Int. Cl.
B24B 49/00 (2006.01)
B24B 51/00 (2006.01)
(52) U.S. Cl. .................... 451/9; 451/339; 414/749.1
(58) Field of Classification Search .............. 414/680, 414/749.1; 451/5, 8, 9, 11, 65, 66, 67, 331, 451/339
See application file for complete search history.

(56) References Cited

U.S. PATENT DOCUMENTS

| | | | |
|---|---|---|---|
| 6,402,598 B1 * | 6/2002 | Ahn et al. ............... 451/65 |
| 6,435,941 B1 * | 8/2002 | White .................... 451/5 |
| 6,488,565 B1 * | 12/2002 | White et al. ............. 451/5 |
| 6,852,007 B1 * | 2/2005 | Gonzalez-Martin et al. ... 451/28 |
| 7,229,339 B2 * | 6/2007 | Stumpf et al. ............ 451/8 |
| 7,241,203 B1 * | 7/2007 | Chen et al. .............. 451/11 |
| 7,335,092 B1 * | 2/2008 | Severson et al. .......... 451/288 |
| 7,354,335 B2 * | 4/2008 | Marquardt et al. ........ 451/11 |
| 7,367,866 B2 * | 5/2008 | Jeong .................. 451/5 |
| 2005/0202677 A1 * | 9/2005 | Hsu et al. ............... 438/692 |
| 2005/0227595 A1 | 10/2005 | Marquardt et al. |
| 2006/0003671 A1 | 1/2006 | Stumpf et al. |
| 2007/0281589 A1 * | 12/2007 | Oh et al. ............... 451/11 |

OTHER PUBLICATIONS

Novellus GAMMA 2130 Atmospheric Robot (Comparison between Current Design and New Direct Drive Design), Novellus Robotics Engineering, Aug. 16, 2005, 7 pages.

* cited by examiner

Primary Examiner—Timothy V Eley
(74) Attorney, Agent, or Firm—Weaver Austin Villeneuve & Sampson LLP

(57) ABSTRACT

A work piece handling apparatus moves workpieces with a plurality of independently movable load cups that have combined multiple axes of motion. The apparatus can load and unload work pieces from a wet process station and move work pieces between wet process stations and maintain wet chemistry delivery to the workpiece without involving a robot. A method of work piece handling using the apparatus provides a significant throughput improvement by reducing the inherent time lag of pneumatic systems and eliminating multiple steps involving the robot during inter-station wafer transfer.

29 Claims, 9 Drawing Sheets

HIGH THROUGHPUT SERVO LOAD CUP WITH INTEGRATED WET CHEMISTRY DELIVERY

FIELD OF INVENTION

The present invention pertains to apparatus used in semiconductor processes, and more particularly to apparatus and methods used for work piece handling and movement during wet processes. The apparatus and methods are particularly useful to for transferring wafers between CMP stations and for loading and unloading wafers from a CMP station.

BACKGROUND OF THE INVENTION

Automated loading and unloading of work pieces in and out of a processing apparatus and in between processing apparatuses are often accomplished with robotically controlled load and unload mechanisms. Particularly, wet semiconductor manufacturing processes have special requirements because the work pieces being transferred are often wet, may not allow contact except for at the periphery of the work piece, and may also require continued application of wet chemicals.

One such a manufacturing process is chemical mechanical planarization (CMP) of a wafer. The CMP method typically requires the work piece to be loaded into and mounted precisely on a carrier head in a manner such that the surface to be planarized is exposed. The exposed side of the work piece is then held against a polishing pad and polished using a relative motion between the work piece surface and the polishing pad in the presence of a polishing slurry. Following the planarization, each wafer is unloaded from the carrier head and transferred to a subsequent processing apparatus such as another polishing station, a buffing station, a cleaning station or a spin-rinse-dry (SRD) station.

The conventional CMP carrier head includes a flexible diaphragm against which the back surface (the surface that is not to be polished) is pressed. The flexible diaphragm is surrounded by an annular wear ring or retaining ring having an inner diameter only slightly greater than the diameter of the work piece to be polished. The diaphragm and the wear ring form a cavity into which the work piece must be loaded. To carry out the planarization operation, the work piece must be mounted against the diaphragm within the confines of the wear ring. In the CMP processing of a wafer the recess into which the wafer must be loaded has a depth on the order of the thickness of the wafer itself, or about 0.75 mm, and the clearance between the inner diameter of the wear ring and the outer diameter of the wafer is typically less than 1 mm.

A CMP load cup mechanism capable of transferring a work piece to the carrier head such that the work piece can be mounted within the confines of the wear ring with a high degree of precision and without contacting the front surfaces of the work piece was described in U.S. patent application Ser. No. 10/821,758 titled "CMP Apparatus and Load Cup Mechanism" and filed Apr. 9, 2004 and U.S. patent application Ser. No. 10/884,371 titled "CMP Apparatus and Method" filed on Jul. 2, 2004, both of which are incorporated herein by reference in its entirely for all purposes. With this load cup mechanism, a front-end robot first transfers a work piece, such as a semiconductor wafer, from a work piece cache to a load or handoff station from where a back-end robot picks up the work piece. The back-end robot moves the work piece to one of several load cups, each associated with a process station, also known as a platen. The load cups receive the work piece and moves the work piece to a position directly beneath a carrier head. There, the carrier head and the load cup engage, and the work piece is transferred to the carrier head. The now empty load cup moves away from the process station, and the processing ensues. After the work piece is planarized, the reverse happens. The load cup engages with the carrier head to receive the processed work piece, and moves the work piece to a "home" position where the back-end robot picks up the work piece. The back-end robot then loads another work piece onto the load cup, which transfers it to the carrier head associated with that load cup.

However, from the time the load cup mechanism unloads the work piece from the processing station to the time the load cup mechanism returns to the station with an unprocessed work piece, the station sits idle. Because one backend robot may serve four or more process stations, this loading and unload of work pieces onto the load cups can become a bottleneck. If more than one station requires a new work piece, the load cup mechanism would have to wait for the robot to become available. While a load cup waits for the back-end robot, the process station sits idle. It is therefore desirable to provide an improved work piece handling mechanism that reduces the idle time and increases the throughput of the tool.

SUMMARY OF THE INVENTION

A work piece handling apparatus moves work pieces with two or more independently movable load cups that have multiple combined axes of motion (four in one example). Each load cup can move in an arc-shaped trajectory by pivoting about an axis of rotation while translating along an s-axis of horizontal motion. In addition, the apparatus may have a z-axis (vertical) motion. Furthermore, instead of a single s-axis of horizontal motion, the apparatus may have both an x-axis and y-axis of horizontal motion. To increase throughput, the apparatus can load and unload work pieces from a process station and move work pieces between wet process stations and maintain wet chemical delivery to the work piece without involving a back-end robot. The loading and unloading of the load cups from and to a back-end robot can occur while the work pieces are being processed, instead of while a process station is idle waiting for another work piece. Another increase in throughput arises from using a servo mechanism to move the load cups swiftly and precisely, instead of using a pneumatic mechanism.

In one aspect, the invention pertains to a work piece handling mechanism. The mechanism includes a plurality of load cups configured to pivot about an axis of rotation independently and a motor for driving rotation of at least one load cup. Of course, more than one motor may be included for the remaining load cups. Each load cup is configured to load and unload a work piece to and from at least two process stations and between a transfer position and a process station. This transfer position may be any position where the load cups can load and unload. The transfer may be between a back-end robot and the load cup or another mechanism where the work piece may be put.

The load cups may share a common rotational axis, or have different rotational axes. Note that the load cups may pivot in an arc-shaped trajectory about a rotation axis that is outside of the load cups themselves. In certain embodiments, a position sensor, such as an encoder, is coupled via a motor to each load cup to read an angular position for each load cup. The angular position is fed back to a controller mechanism. The load cups may be coupled to a "theta assembly," which includes the motors for driving rotation and a shaft. A servo motor may move the theta assembly in a horizontal direction along one or more axes. Movement along a single horizontal direction is also referred to movement along the s-axis. In certain embodiments, a second sensor may be used to read a horizontal position for the theta assembly, and feed the position information to the motor and the controller.

The theta assembly may also include a servo motor for each load cup to move in a vertical direction and a sensor coupled to each load cup configured to read a vertical position (z-axis) for each load cup. In another embodiment, the vertical motor may be configured to move all the load cups in a vertical direction, and only one sensor is included to read the vertical position for the load cups. The vertical motor may be coupled to a ball screw, which may or may not share the shaft with the motors for driving rotation. In certain embodiments, two load cups are provided on the work piece handling mechanism. The mechanism may also include a liquid delivery line coupled to each load cup and a plurality of nozzles on each load cup configured to spray liquid onto one or two sides of the work piece.

The mechanism may also include one or more labyrinth moisture covers positioned between the rotational motors and load cups. The moisture cover prevents particles from moving between a work piece processing environment and an IC fabrication environment.

The process stations served by the load cup may be, for example, chemical mechanical polishing (CMP), electrochemical mechanical polishing (ECMP), grinding, lapping, buffing, electroplating, electroless plating, etching, cleaning, rinsing or drying stations. In certain embodiments, the process station is a wet processing station and may be a CMP station.

In another aspect, the present invention pertains to a semiconductor processing apparatus including a number of process stations arranged in at least two rows, one or more transfer load cup mechanisms, each having two or more independently movable load cups, and a first robot positioned between the rows configured to transfer a semiconductor wafer to be processed onto a load cup and remove a processed wafer from a load cup. The first robot is sometimes referred to as the back-end robot. Each load cup is configurable to load and unload a wafer to and from two or more stations. The load cup mechanism may include a plurality of motors to move the load cups in a horizontal and a vertical direction, a plurality of motors to rotate the load cups independently in an angular direction, a plurality of sensors to read the angular, horizontal, and vertical positions of each load cup, and a controller capable of executing a set of instructions. The load cups may move in such a way to avoid possible pathways of the first robot such that no collision is ever possible. The semiconductor process apparatus may be a CMP tool, and the process stations may be CMP stations.

In another aspect, the invention pertains to a load cup mechanism having two or more load cups configured to move independently. The mechanism is configured to unload a processed wafer from a station with a first load cup and load an unprocessed wafer onto the station with a second load cup. The load cup mechanism may be associated with one or more process stations, which may be one or more CMP stations.

In yet another aspect, the invention pertains to methods of transferring work pieces in a wet processing tool. A method of work piece handling using inventive apparatus described herein can provide a significant throughput improvement by, e.g., eliminating a wait for the back-end robot during work piece loading and unloading; and eliminating multiple steps involving the back-end robot during inter-station work piece transfer. A method to move a work piece between process stations may include unloading a first work piece from a first process station into a first load cup; moving the first load cup to a second process station; loading the first work piece onto the second process station; and moving the first load cup to a home position. The home position is a transfer position where the work pieces may be transferred between the back-end robot and the load cups.

In certain embodiments, a method may also include operations to load a second work piece onto the first process station, including the operations of moving a second load cup having the second work piece to the first process station; loading the second work piece onto the first process station from the second load cup; and, moving the second load cup to the home position. The steps to load a second work piece onto the first process station may occur before the first load cup moves (with the first work piece) to a second process station. Yet another method may include operations to unload and load a work piece at a process station. The steps may include unloading a first work piece from a first process station into a first load cup; moving the first load cup away from the first process station; moving a second load cup to the first process station; loading a second work piece from the second load cup onto the first process station; and, moving the second load cup away from the first process station. All these operations may be performed without interfacing with a back end robot. The above methods may be practiced in a CMP tool, or any other wet or dry processing tool.

The invention may also be more generally applicable in other semiconductor processing contexts. For example, these apparatus and methods may be applicable to any semiconductor process requiring precise and efficient work piece transfer between two or more stations or chambers. These and other features and advantages of the present invention will be described in more detail below with reference to the associated drawings.

DETAILED DESCRIPTION

Figure 1:
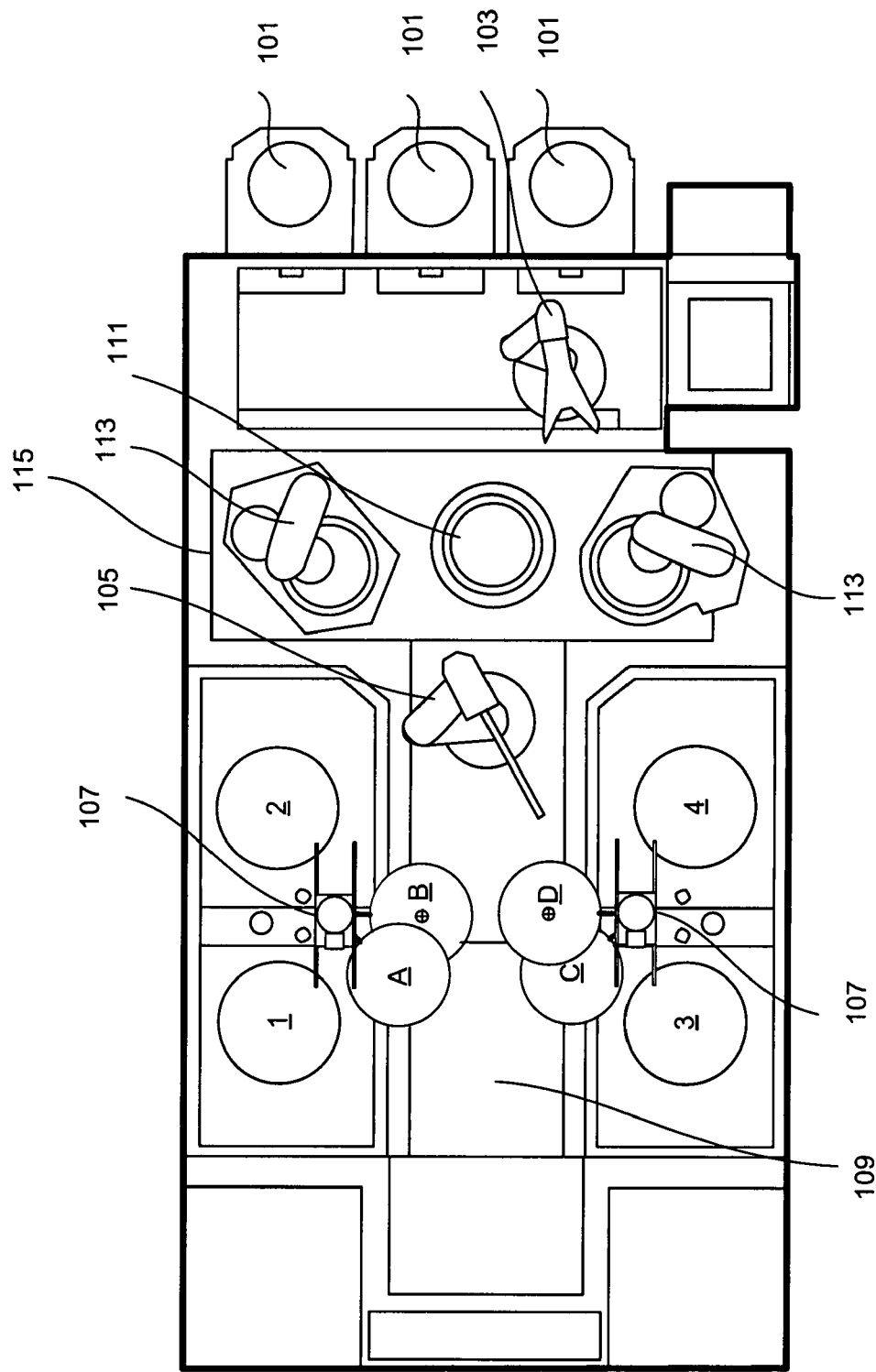
FIG. 1 is a schematic diagram of a semiconductor processing tool suitable for implementing the present invention.

Embodiments of the present invention are described herein in the context of chemical mechanical polishing (CMP). Those of ordinary skill in the art will realize that the following detailed description of the present invention is illustrative only and is not intended to be in any way limiting. Other embodiments of the present invention will readily suggest themselves to such skilled persons having the benefit of this disclosure. For example, although CMP processing is used in the discussion, the mechanism and methods of the present invention are effective in all wet processing applications that require substrate transfer between stations. Other wet processing applications and stations include electrochemical mechanical polishing (ECMP), grinding, lapping, buffing, electroplating, electroless plating, etching, cleaning, rinsing or drying.

In this application, the terms "work piece," "wafer" and "substrate" will be used interchangeably. The following detailed description assumes the invention is implemented on a wafer. However, the invention is not so limited. The work piece may be of various shapes, sizes, and materials.

As discussed above, in a wet processing tool such as a CMP tool, a back-end robot may pick up a wafer from a load or handoff station and drop off the wafer at one of several load cup mechanisms. The back-end robot arm is configured to pick a processed wafer from the load cup mechanism and drop off an unprocessed wafer. In one design, the robot arm has two sides. The arm can pick a wafer on an empty side, rotate 180 degrees, and drop off the wafer on the opposite side.

As described herein, a load cup is an apparatus in a semiconductor processing tool configured to receive a semiconductor wafer, such as a 300 mm wafer, from a robot or another wafer handling device and to load the wafer onto a process station without contact with the back side of the wafer except at the very periphery. As described herein, a load cup mechanism is an apparatus including one or more load cups that are coupled to one another, associated motors and driving mechanisms for transferring a wafer from one location to another along multiple axes of motion, sensors to determine location of the load cups, and any associated cables and wet chemical lines. A load cup mechanism is an apparatus configured to receive a semiconductor wafer from a robot or another wafer handling device; move the wafer from one location to another, such as from one process station to another process station; and to load the wafer onto a wet process station. In certain embodiments, a load cup contains one or more of the following features. A load cup is self contained piece of hardware or mechanism that provides the ability to insert a wafer into the polishing head very reliably. It supports the wafer at the edge since the wafer is device side down. It provides a passive self-centering mechanism to align itself to the polish head and provides spring compliance for any tolerance or calibration issues of the transport device (TLC) allowing the wafer to be fully pressed against the polish head bladder for acquisition. Also the load cup provides direct liquid spray to the wafer and has a wafer presence sensor for detection of the wafer.

With many wafers, the surfaces can be easily damaged if they are contacted during the loading and unloading processes. Because of this, the loading and unloading should preferably be done in a manner such that only the edge of the wafer or, at most, the surface within a narrow distance from the edge is contacted during the process. With the CMP processing of wafers, this requirement is made even more significant by the adoption of new wafer-handling standards for 300 mm wafers that preclude all contact with the major portion of the surfaces of the wafer. Thus no significant contact with the front surface of the wafer is permitted and even known vacuum end-effectors or other end-effectors that grip or touch the back surface of the wafer are not allowed. These requirements and restrictions place serious limitations on the mechanisms used to handle the wafers.

Some CMP processing requires the wafer to undergo polishing in two separate stations. In those cases, the stations may use different slurry chemistry, pads, relative motion, and pressure of the diaphragm against the wafer. Particularly, for copper damascene processing, two CMP operations may be used: one for planarizing the bulk copper and one for planarizing the diffusion barrier layer, which is usually thinner and harder. In these cases, the wafer is transferred between two process stations. In the case where load cup mechanisms are dedicated to single stations only, the back-end robot must also participate in the interstation transfer by picking up the wafer from one load cup and putting it on the other load cup. While in the load cup, the wafers continuously receive liquid delivered through a wet chemistry line. The liquid may include deionized (DI) water, polishing slurry, acids such as glycolic acid, bases such as ammonium hydroxide, and solvents such as isopropyl alcohol. The liquid can modify, etch or passivate the surface, and ensure that the wafer stays wet and avoid ambient air interacting with the planarized wafer.

Certain embodiments of the present invention avoid the inefficient use of the process stations caused by the wait and delay involving the back-end robot, and avoid possible drying of the wafer during interstation transfer. Instead of having a load cup mechanism associated with one processing station, a mechanism may be associated with two or more stations. The mechanism can load and unload wafers from a wet processing station and move wafers between wet process stations while maintaining wet chemistry delivery to the wafer without involving the back-end robot.

Apparatus

FIG. 1 shows the schematic of a processing tool of the present invention. Wafers enter the tool from wafer caches 101, usually in the form of cassettes or front opening universal pods (FOUPs) holding tens of wafers at a time. The tool shown has three such wafer caches, but more or fewer may be used. Four processing stations 1 to 4 are shown in two rows, with a load cup mechanism 107 in between two stations of the same row (for example, 1 and 2). A front-end robot 103 picks wafers from the caches and transfers them, one at a time, to a load or handoff station (not shown) located in the front end module 115 below the brush modules 113 and megasonic cleaner/dryer 111. A back-end robot 105, positioned in the service corridor 109 between the two rows of CMP stations, retrieves the wafer from the handoff station and transfers the wafer onto one of four load cups A, B, C, or D. In the depicted embodiment, the load cups are positioned at the "home" location for the transfer of wafers to and from the back-end robot. As shown, load cups B and D are in the home position; load cups A and C are not in the home position. The home position is two-dimensional, defined by the x and y position of the load cups. Because the load cups on the same mechanism have different z positions (vertical positions), the load cups on the same mechanism can occupy the home position simultaneously. The back-end robot is able to place a wafer onto either the lower or upper load cup.

Figure 2A:
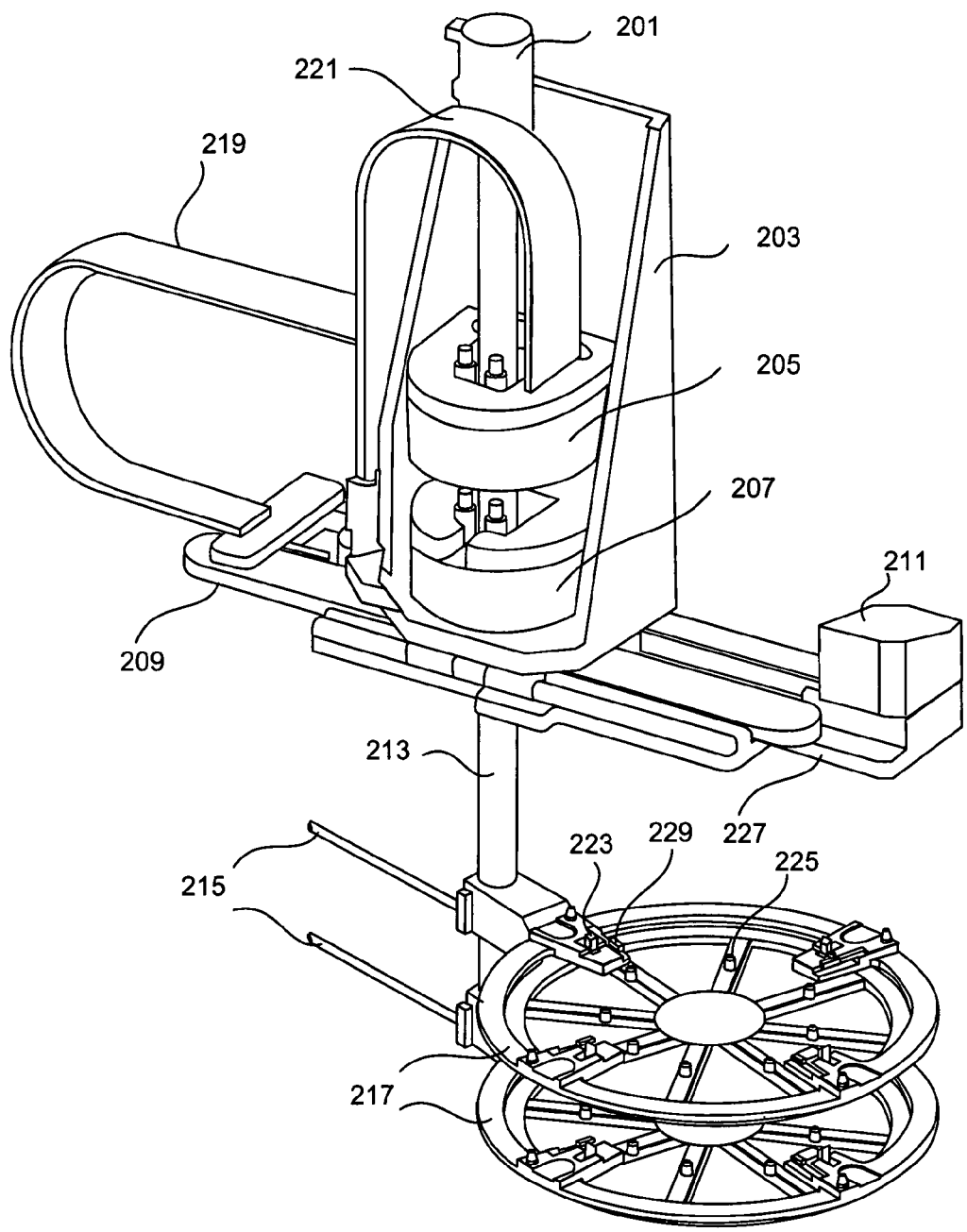
FIGS. 2A and B are perspective views of an embodiment in accordance with the present invention.

FIG. 2A shows a schematic perspective view of a servo load cup mechanism in accordance with certain embodiments of the present invention. A total of four motors are shown; they are used to move the load cups on various axes. First, the z-axis translational motor 201 controls the vertical position of the load cups. The z-axis motor may use any mechanism to move the load cups precisely and rapidly. Particularly, a ballscrew mechanism may be used to move the load cups vertically, or it may use another mechanism such as toothed gears to move the load cups. Second, each load cup 217 is coupled to a motor (205 or 207) that drives the rotation (pivoting) through the shaft 213. As pictured, the load cups share an axis of rotation, but that is not necessary. The load cups may pivot about different axes. Note that the axis of rotation is offset from the internal central axes of the load cups. Thus, the load cups pivot about the axis in a pendular motion. The fourth motor is a translational s-axis motor 211 that moves the entire "theta assembly" along an s-axis on a linear bearing. The theta assembly includes the housing 203, the z-axis motor 201, the two motors driving rotation (205 and 207), the shaft 213, and the load cups 217. As with the z-axis motor, the s-axis motor may employ any mechanism to precisely and rapidly move the theta assembly along the s-axis. For example, a belt driven mechanism may be used. In other embodiments, the "theta assembly" may move along two translational directions, being driven by two motors that independently control the x-axis and y-axis of horizontal motion.

The s-motor is mounted in a platform 227 mounted above the rows of process stations. Platform 227 separates two different regions of the tool: the IC fabrication environment and the wet processing environment. The wet processing environment, below the platform where the load cups are located, can be exposed to various wet chemicals and particles. Such chemicals and particles could contaminate the fabrication region if they cross the platform boundary. In the depicted embodiment, labyrinth moisture covers 209 separate the two environments. In a specific embodiment, labyrinth moisture covers 209 are aluminum non-contact seals that effectively prevent chemicals and particles from the wet process environment from entering the fabrication environment. They are mounted on either side of the theta assembly track. Of course, other types of seals may be used to effectively segregate the two environments.

As the theta assembly moves along the s-axis, flexible cable track 219 moves along with the assembly. Cable tracks 219 and 221 contain all the cables required to power the motors and carry the signals between the controller, motor, and sensors. Cable track 219 connects to from the platform 227 to the theta assembly. Cable track 221 connects various motors and sensors within the theta assembly.

A sensor is coupled with each motor and measures the location of the load cups along or about the relevant axis. Precise measurement of the location of the load cups is required to load and unload the wafers from the carrier head with very small clearances. As discussed above, clearance between the inner diameter of the wear ring of the carrier head, into which the wafer must be placed, and the outer diameter of the semiconductor wafer is typically less than 1 mm. In certain embodiments, absolute encoders are used to be certain of load cup locations. Absolute encoders measure location and convert the location information to a signal, which is transmitted to a controller. For each and every location, a different signal is generated. On the other hand, relative encoders measure location only relative to the starting point, usually by counting a number of pulses of known position increments, and converting the count to location by adding the starting location and the product of the count and size of the increments. Although absolute encoders are preferred, relative encoders may be used if adequate precaution is taken to avoid a collision after a loss of power.

As discussed above, it is preferable that wet chemical application to the wafer is maintained during transfer between processing stations. An unprocessed wafer may also need to be rinsed or treated prior to the first process operation. Load cup liquid lines 215 connect a wet chemistry source (not shown) to each load cup. The liquid lines are preferentially made of a flexible material that can accommodate movement of the load cup mechanism along the s-axis and z-axis. The liquid is sprayed onto the wafers through nozzles 225 on the load cup.

In certain embodiments, the back-end robot delivers wafers to the load cups, device side down. The back-end robot lowers the wafer down the beveled edge of guide fingers 223 onto lift fingers 229. The guide fingers 223 center the wafer on the load cup. The guide fingers are positioned along a circular path having a diameter slightly greater than the diameter of the wafer. As the wafer is transferred to the load cup, it is captured by vertical surfaces of the guide fingers. If a wafer is slightly off center as it is transferred, beveled edges of the guide fingers 223 guide the wafer to a centered position defined by the vertical surfaces. The lift fingers 229 are also positioned along a circular path, but have a diameter slightly less than the diameter of the wafer to be handled so that only the outer 1 mm of the wafer is contacted.

Figure 2B:
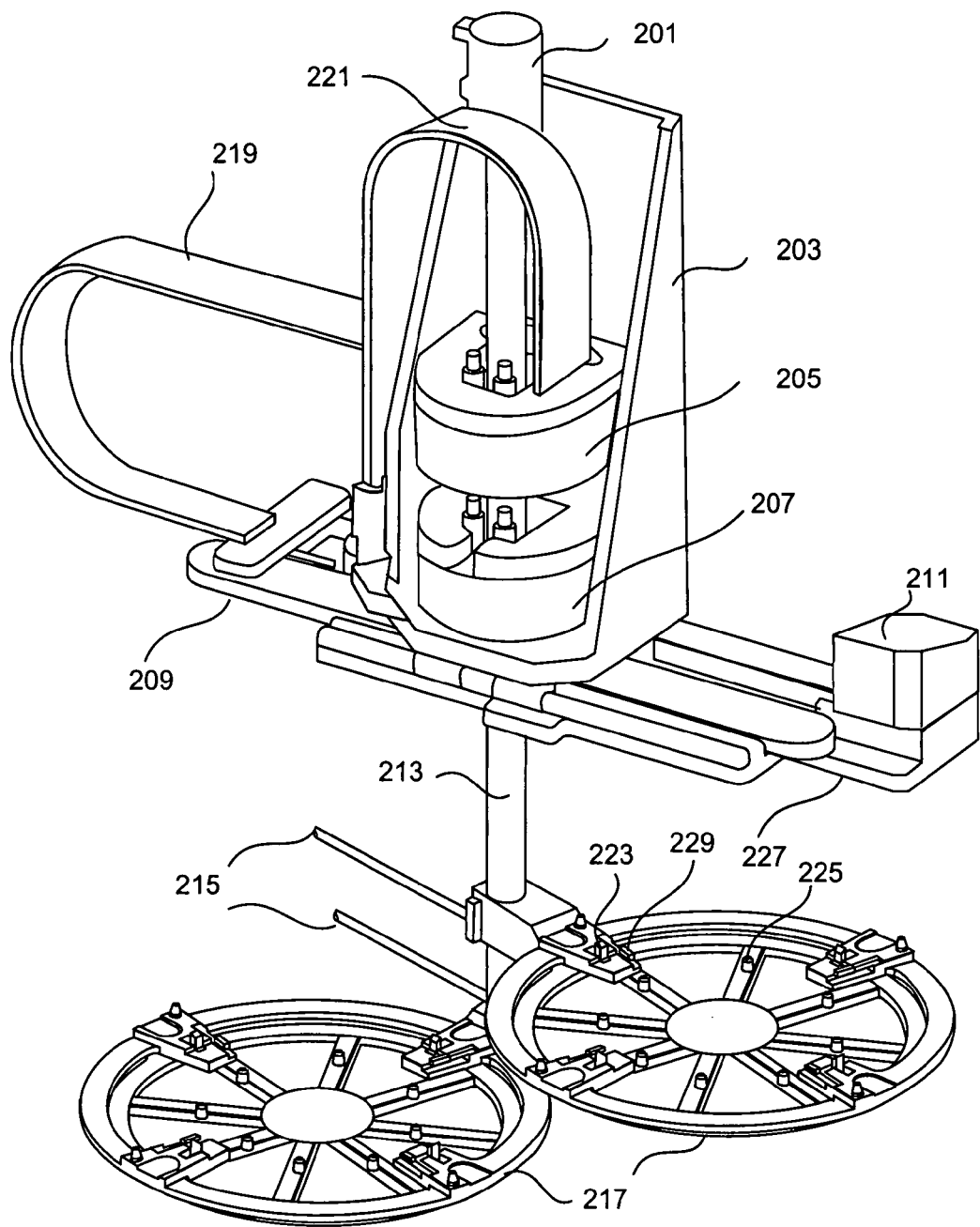

FIG. 2B shows the load cup mechanism with the load cups at different angles. Note that the entire shaft moves along the s-axis with the load cups. The shaft provides the shared axis of rotation for the load cups, and is driven in the vertical direction by the z-axis motor, which is coupled to the ballscrew. Other variations are possible. The axis of rotation need not be shared between the load cups. In some cases, the entire theta assembly may move vertically. In other cases, if the processing stations are located close enough to each other, the s-axis movement will not be necessary. By rotation alone the load cups may be able to load and unload wafers from the carrier heads. In such a case, the load cup mechanism would not include the s-axis motor, belt, sensors, along with the associated cables. In certain embodiments, the load cup mechanism would not include the z-axis motor. Because the carrier head also moves vertically, it may be possible to load and unload wafers from a carrier head without moving the load cups vertically.

Wafer Movement Sequences

Figure 3:
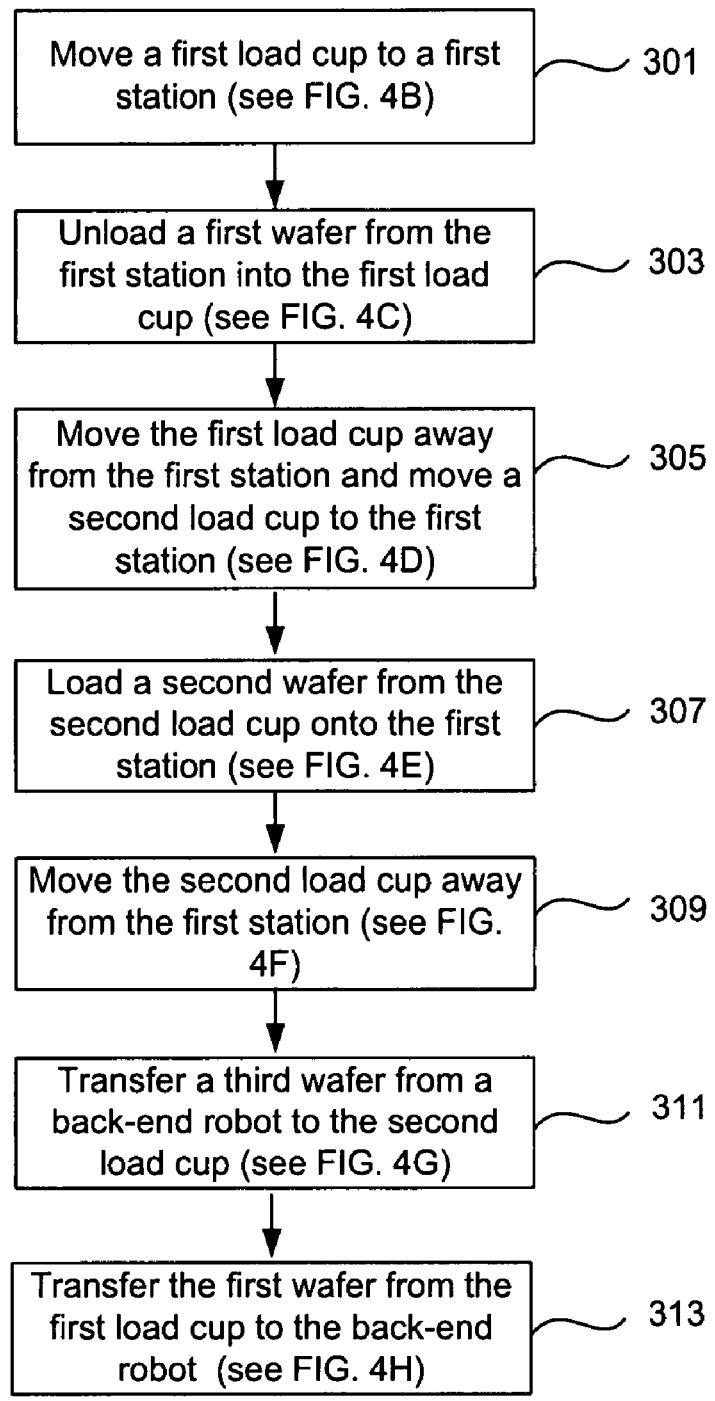
FIG. 3 is a process flow diagram of certain method embodiments in accordance with the present invention.

The benefits of the present invention in terms of time savings can be best explained by comparing the wafer movements. FIG. 3 is a process flow chart showing the load cup mechanism motions that may be employed for a single process station. Many CMP processes are either one-step or two-step processes. For a one-step process, each process station planarizes an unprocessed wafer. Once planarized, the wafer is cleaned and dried before it is returned to one of the wafer caches. The load cup mechanism would need to unload the processed wafer, load an unprocessed wafer, and exchange the processed wafer with an unprocessed wafer with the back-end robot.

Figure 4A:
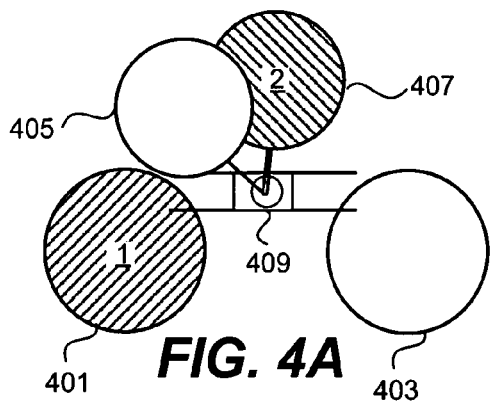
FIGS. 4A-H illustrates schematically the movements of the load cups and wafers in accordance with FIG. 3.

In order to clarify the movements of the wafer and the load cups, schematic diagrams corresponding to each process operation are shown in FIGS. 4A to 4H. FIG. 4A shows the location of the wafers and load cups while wafer 1 is being processed at station 1 (401). In this example, no process is being performed in station 2 (403) in FIGS. 4A to 4H. The larger circles 401 and 403 are the process stations 1 and 2. Shading denotes the presence of a wafer, which is numbered to show how the locations change. For example, in FIG. 4A, wafer 1 is in process station 1 (401) and no wafer is in process station 2 (403). Between the process stations is the load cup mechanism 409. The smaller circles represent the load cups A (405) and B (407), each connected to a portion of the mechanism 409. To distinguish between the two load cups, the connection line between the mechanism and load cup B has two lines, and the connection line between the mechanism and load cup A has only one line. FIG. 4A shows load cup B at the home position with wafer 2 while load cup A is empty.

Figure 4E:
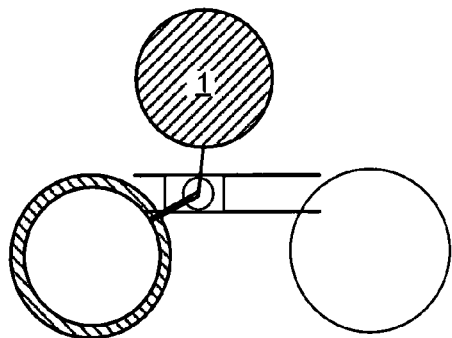
Figure 4B:
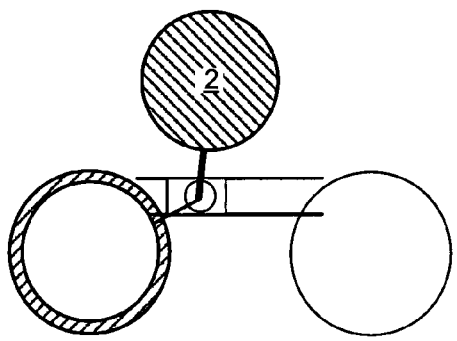
Figure 4F:
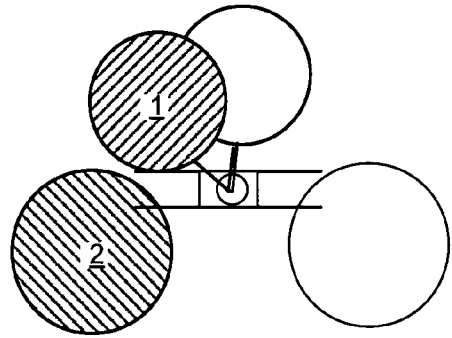
Figure 4C:
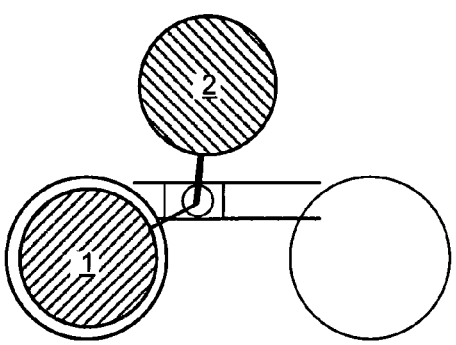
Figure 4G:
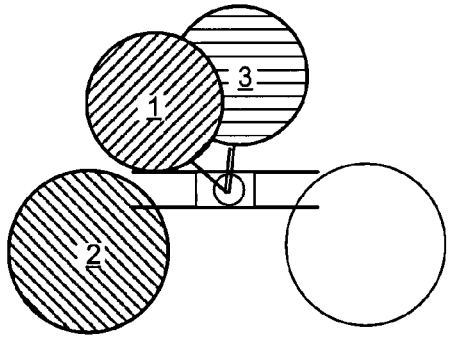
Figure 4D:
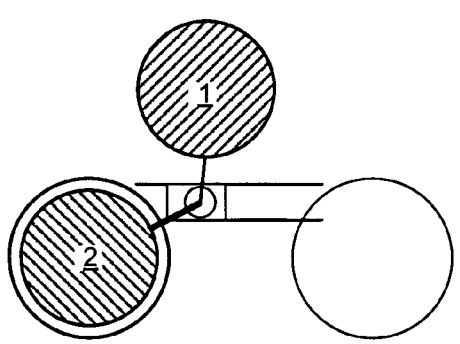
Figure 4H:
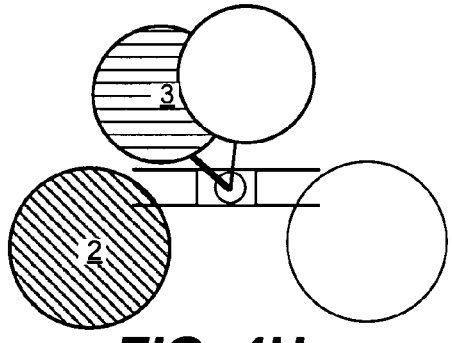

In the following description, reference is made to both operations in the flow chart of FIG. 3 (shown as parenthetical references) and the schematic drawings of FIGS. 4A-4H. After wafer 1 is planarized and the carrier head moves up from the platen, load cup A is moved to station 1 (301). FIG. 4B illustrates the positions of the parts. The empty load cup A is moved into position below wafer 1 on the carrier head by rotating load cup A and moving the mechanism along the s-axis. Then wafer 1 is unloaded from station 1 into load cup A (303). As shown in FIG. 4C, the shading, denoting the wafer, has moved from station 1 to load cup A. Then both load cups rotate such that load cup A moves away from station 1 and load cup B moves into station 1 (305). Because the load cups are vertically offset from each other, both may rotate at the same time without a possibility of colliding. FIG. 4D shows the load cups after rotation. Note that although load cup A is away from station 1, it is not at the home position because the mechanism has moved along the s-axis. Then wafer 2 from load cup B is loaded onto station 1 (307). The shading in FIG. 4E shows that the wafer was moved from load cup B to station 1. To load a wafer, the load cup raises the wafer into the carrier head until it is secured in the cavity within the wear ring. In some embodiments, the load cup does not move vertically, instead the carrier head moves vertically to engage the load cup. After the wafer 2 is loaded, the now empty load cup B moves away from station 1 (409) to allow the processing at station 1 to begin. For a CMP station, the carrier head would lower onto the polishing platen. As a slurry is injected onto the surface of the pad on the platen, the head and the platen rotate and move against each other to planarize the surface of the wafer. FIG. 4F shows the empty load cup B at the home position. Note that the entire mechanism also moved along the s-axis to reach the home position. There, the back-end robot transfers wafer 3 to load cup B (311). FIG. 4G shows load cup B with new shaded wafer 3. Then the backend robot picks up wafer 1 from load cup A (313). FIG. 4H shows the load cup mechanism with an empty load cup A and load cup B having wafer 3. Now wafer 3 is ready to be switched with wafer 2 once the processing at station 1 is complete.

Although the wafer movement operations are described above according to FIGS. 3-4H in a particular order, the events need not occur in such particular order. For example, operations 311 and 313 can be switched. The back-end robot can pick up wafer 1 before dropping off wafer 3. Further, although the load cups rotate simultaneously in 305, the rotation need not be simultaneous: load cup A can move away first, then load cup B can move to the station. Also, although the FIGS. 4G-H show the load cups at different angular positions, both load cups may be at the home position at the same time. As discussed above, the home position is not vertical position dependent. In other words, both load cups may be at the home position simultaneously because they are offset vertically. Of course, in the case where both load cups may be at "home" at the same time, the back-end robot must be able to place and retrieve wafers from different vertical positions.

To summarize the wafer movement for a single station unload and load, an empty first load cup would move to the station, unload a first wafer from the station to the load cup, then move away while a second load cup with a second wafer would move to the station. The second load cup would load the second wafer and then move away. At this time the process station can start processing the second wafer. Compared with the situation where the back-end robot is involved with a single load cup, the process station no longer sits idle while the first wafer is transferred to the back-end robot and the second wafer is transferred to the to the load cup. Operations 311 and 313, which involve both load cups and the back-end robot can be accomplished while the station is processing a wafer. If the back-end robot is available, the reduction in idle time may be up to 22 seconds per transfer, including the time savings from using servo mechanism, which is faster. If the back-end robot is not available, then the reduction is even greater. Reduction in idle time increases wafer throughput, in this case by as much as 10-15 percent.

Figure 5:
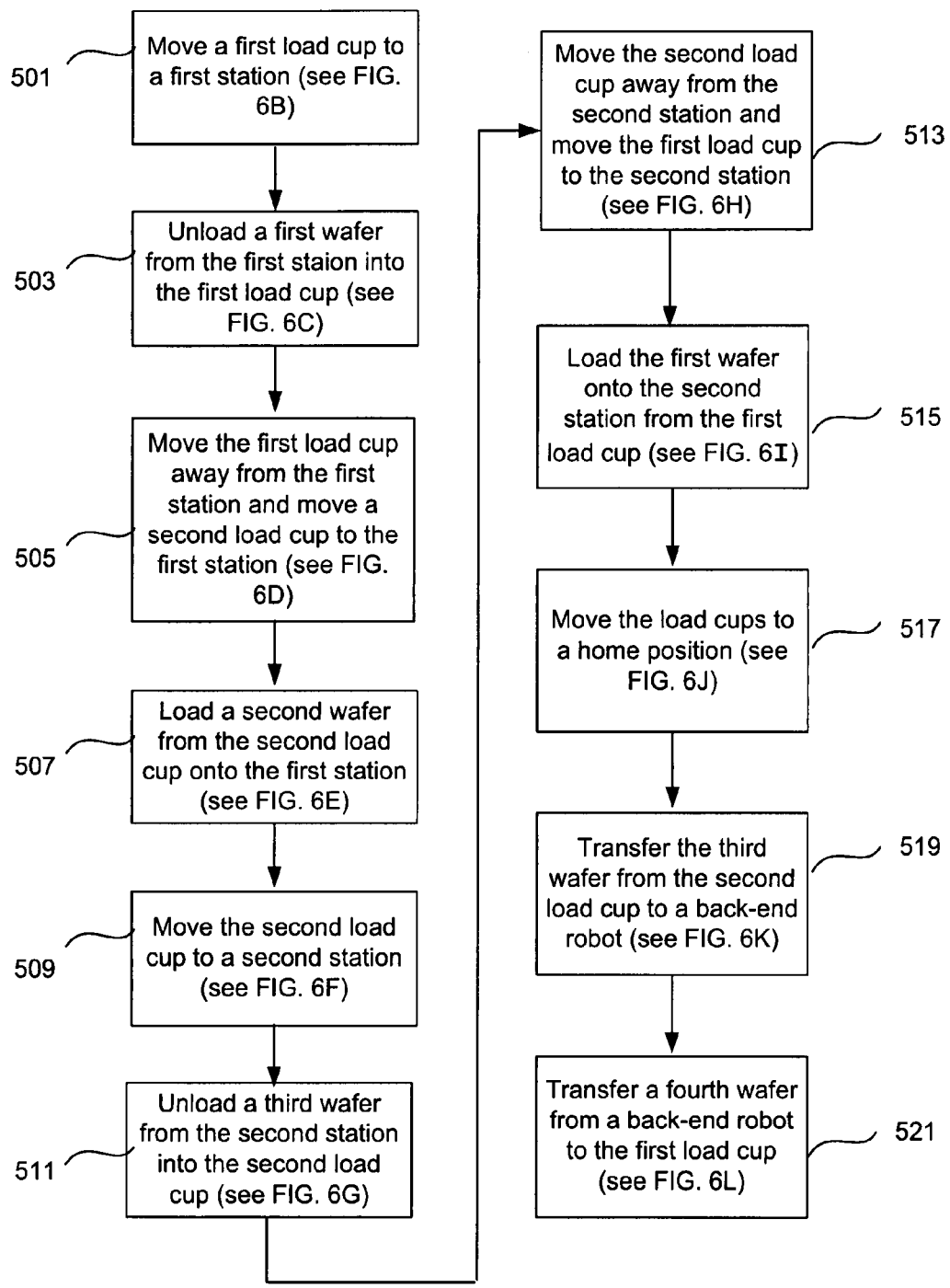
FIG. 5 is a process flow diagram of certain method embodiments in accordance with the present invention.

A second set of wafer movement sequences involve transferring a wafer from the first station to the second, loading the first station, and exchanging the processed wafer from the second station for an unprocessed wafer. FIG. 5 is a process flow diagram of this interstation wafer transfer.

Figure 6A:
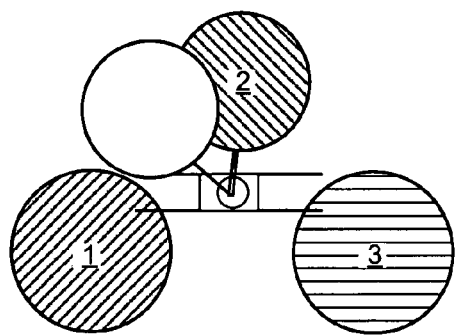
FIGS. 6A-L illustrates schematically the movements of the load cups and wafers in accordance with FIG. 5.
Figure 6D:
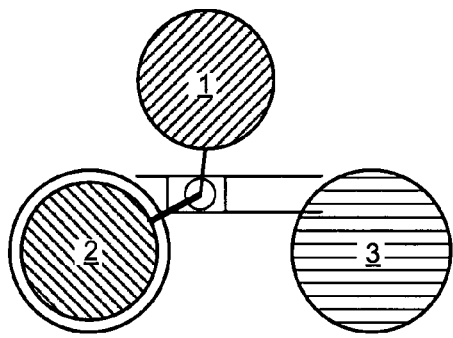
Figure 6B:
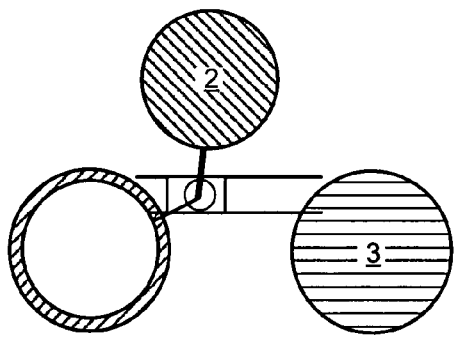
Figure 6E:
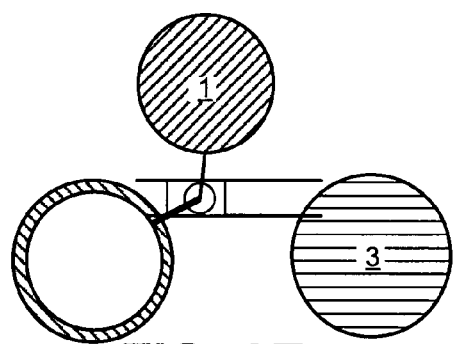
Figure 6C:
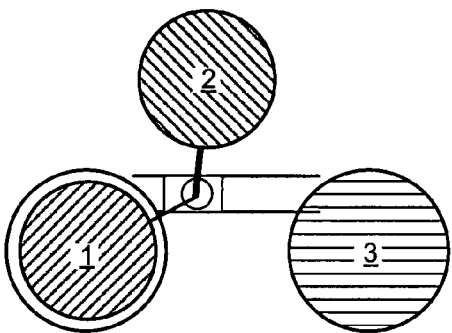
Figure 6F:
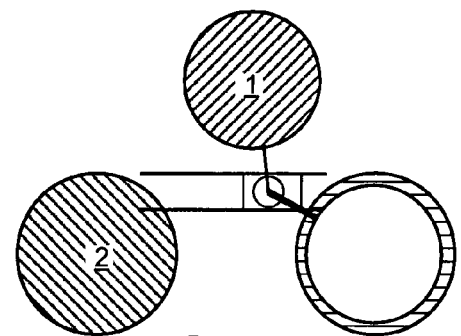
Figure 6G:
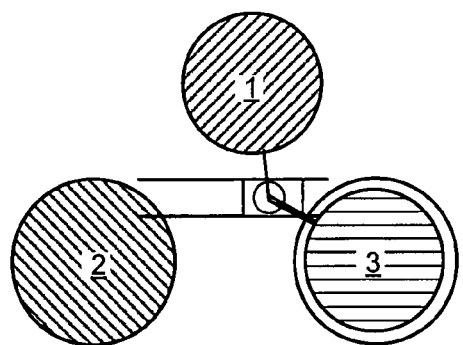
Figure 6J:
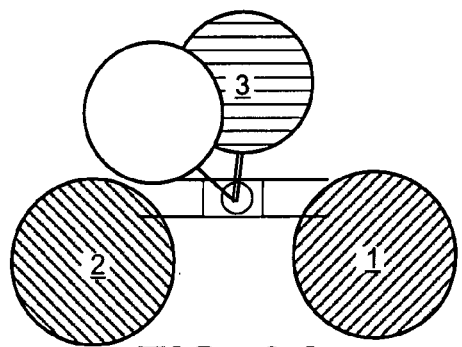
Figure 6H:
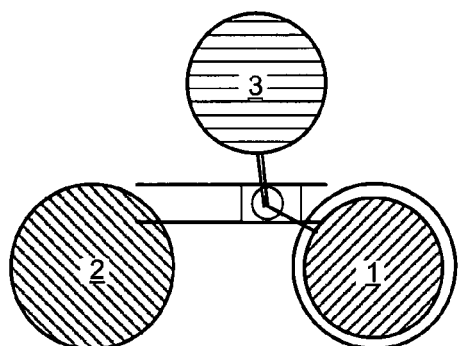
Figure 6K:
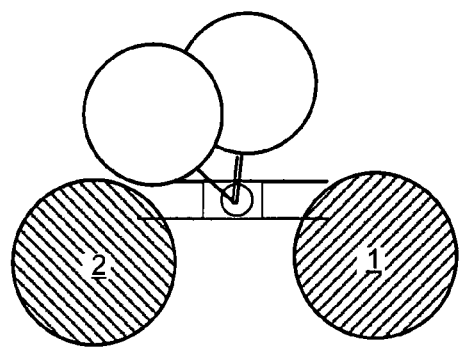
Figure 6I:
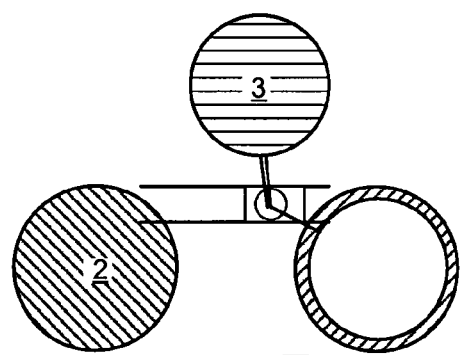
Figure 6L:
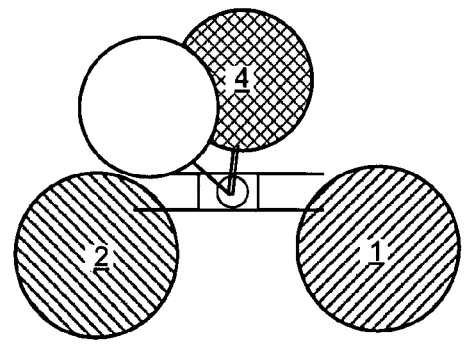

The first four steps of FIG. 5 are the same as the first four steps of FIG. 3, which showed the unloading and loading of a wafer from a single station. The schematic showing the positions of the load cups, wafers, and stations are in FIG. 6. The load cups, wafers, and process stations in FIG. 6 corresponds to the same parts in FIG. 4. First, FIG. 6A shows that wafer 1 is in station 1 and wafer 3 is in station 2, preferably both being processed. The load cup mechanism is ready with a wafer in load cup B and load cup A is empty. When processing is complete at station 1, the empty load cup A is first moved to station 1 (501, FIG. 6B), unloads wafer 1 from station 1 (503, FIGS. 6B-C), and moves away while load cup B moves to station 1 (505, FIG. 6D). Load cup B then loads wafer 2 onto station 1 (507, FIG. 6E). Note that as soon as load cup B moves away, station 1 may start processing wafer 2. The now empty load cup B moves to station 2 (509, FIG. 6F), unloads wafer 3 from station 2 (511, FIG. 6G), and moves away from station 2 while load cup A moves to station 2 (513, FIG. 6H). Load cup A then loads wafer 1 that it unloaded from station 1 onto station 2 (515, FIG. 6I). Both load cups are then moved to a home position (517, FIG. 6J). After load cup A moves away from station 2, processing of wafer 1 proceeds at station 2. At the home position, the back-end robot picks up wafer 3 from load cup B (519, FIG. 6K) and drops off wafer 4 to load cup A (521, FIG. 6L). Note that the operations of 519 and 521 need not occur in any particular order. The back-end robot may drop off wafer 4 first then pick up wafer 3. When both load cups are at the home position, they will have the same angular position. FIG. 4J shows the load cups at different angular positions to distinguish them. In actual practice the load cups would overlap each other.

If the back-end robot is involved with independent load cups for each station during the interstation transfer, not only would it need to perform the two steps previous discussed with the unloading and loading of a single station, the back-end robot would also need to transfer the half-processed wafer from load cup A to load cup B before the wafer can be loaded onto station 2. The total saving in idle for one interstation transfer, including the increased speed of servo mechanisms, may be 45 seconds or greater, resulting in a throughput improvement greater than 25%.

Figure 7:
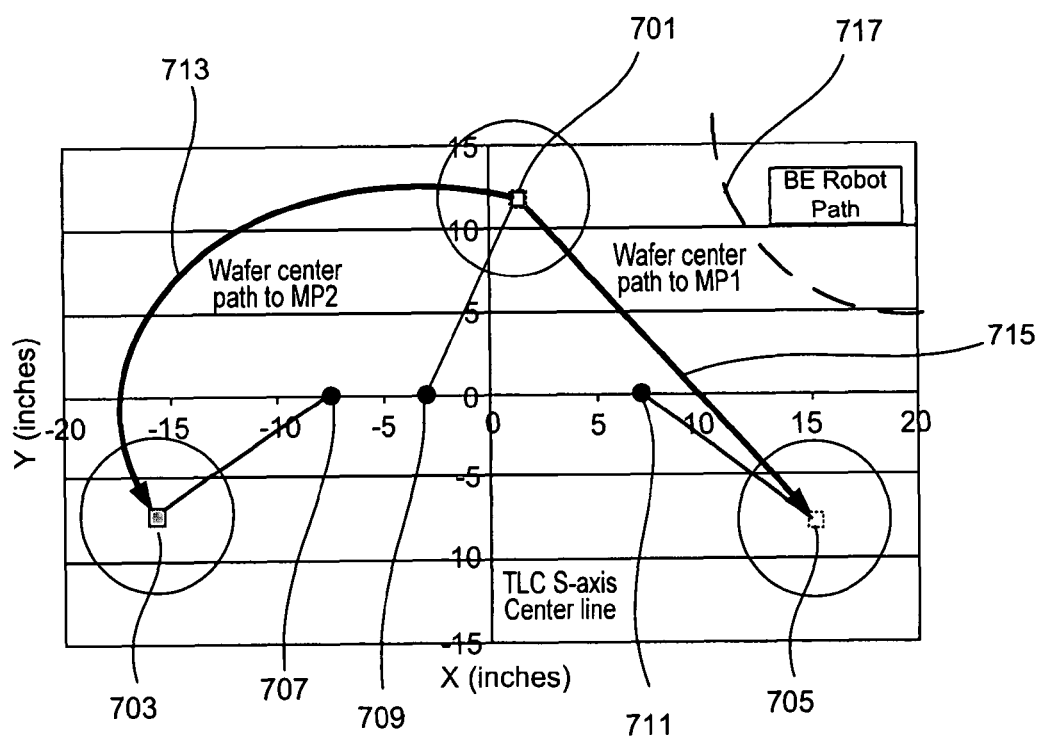
FIG. 7 illustrates the path of travel for the load cups and relative position of the back-end robot

In a particular embodiment, to ensure that the load cups would not collide with the back-end robot, the wafer centers follow different paths to station 1 versus station 2. FIG. 7 is plot of the paths on an x-y chart. The small solid circles 707, 709, and 711 along the x-axis show the positions of the mechanism along the s-axis. The home position of the load cup is indicated as 701. From the home position to station 1 at 703, the load cup follows path 713. The path is created by the load cup rotating at the same time as the mechanism travels along the s-axis from 709 to 707. Hence, the path 713 is a wide arc from 701 to 703. For the load cup path from the home position to station 2, a part of the same kind of wide arc path would interfere in the path of the back-end robot. The back-end robot path is indicated by 717. To avoid the possibility of a collision, the load cup center path 715 from home to station 2 is almost linear such that at no time would a load cup be in a space where the back-end robot may occupy. In order for the load cup to travel in a straight line, the load cup would rotate while the mechanism moves away from station 2 along the s-axis. Then the mechanism moves toward station 2, stopping at 711, while the load cup continues rotating to 705.

Although it is preferred that the load cup path avoid that of the back-end robot, this is not necessary in all cases. One skilled in the art will be able to write a control program such that the robot or the load cup waits for the other to clear the path before proceeding. However, designing paths that do not cross is a simpler way to achieve the same result. Further, the present invention is all about reducing wait times, not creating them.

Although the foregoing invention has been described in some detail for purposes of clarity of understanding, it will be apparent that certain changes and modifications may be practiced within the scope of the appended claims. It should be noted that there are many alternative ways of implementing both the apparatus and process of the present invention. Accordingly, the present embodiments are to be considered as illustrative and not restrictive, and the invention is not to be limited to the details given herein.

What is claimed is:

1. A work piece handling mechanism configured to transfer work pieces between process stations and between a transfer position and a process station, the work piece handling mechanism comprising:
    a plurality of load cups configured to pivot independently;
    a plurality of directional motors to move the plurality of load cups in a horizontal direction and a vertical direction;
    a plurality of rotational motors to pivot the plurality of load cups independently in an angular direction;
    one or more sensors to read the relative or absolute angular, horizontal, and vertical positions of each load cup; and
    a controller capable of executing a set of instructions,
    wherein each load cup is configurable to load and unload a work piece to and from at least two process stations.

2. The mechanism of claim 1, wherein the plurality of load cups share a common pivot axis.

3. The mechanism of claim 1, further comprising a robot for positioning the work pieces into the transfer position.

4. The mechanism of claim 1, wherein the one or more sensors comprises at least one sensor for each load cup.

5. The mechanism of claim 1, further comprising:
    an assembly comprising, at least one rotational motor of the plurality of rotational motors coupled to a shaft connected to one or more load cups of the plurality of load cups;
    a horizontal linear motor of the plurality of directional motors configured to move the assembly in a horizontal direction; and
    a sensor configured to read a relative or absolute horizontal position for the assembly.

6. The mechanism of claim 5, wherein the horizontal linear motor configured to move the assembly in a horizontal direction is a servo motor.

7. The mechanism of claim 5, wherein the shaft is connected to at least two load cups and wherein the horizontal linear motor is configured to move the at least two load cups simultaneously in the horizontal direction.

8. The mechanism of claim 1, further comprising:
    an assembly comprising at least one rotational motor of the plurality of rotational motors coupled to a shaft connected to one or more load cups;
    a vertical linear motor of the plurality of directional motors configured to independently move each load cup in a vertical direction.

9. The mechanism of claim 8, wherein the vertical linear motor configured to move a load cup in a vertical direction is a servo motor.

10. The mechanism of claim 1, further comprising:
    an assembly comprising at least one rotational motor of the plurality of rotational motors coupled to a shaft connected to one or more load cups;
    a linear motor of the plurality of directional motors configured to move the load cups in a vertical direction; and
    a sensor configured to read a vertical position for the load cups.

11. The mechanism of claim 8, wherein the vertical linear motor is coupled to a ball screw.

12. The mechanism of claim 1, wherein the process stations are CMP, ECMP, grinding, lapping, buffing, electroplating, electroless plating, etching, cleaning, rinsing or drying stations.

13. The mechanism of claim 1, wherein the process stations are CMP stations.

14. The mechanism of claim 1, wherein the plurality of load cups is two to six load cups.

15. The mechanism of claim 1, further comprising:
    a liquid delivery line coupled to each load cup of the plurality of load cups and allowing the load cup to move in the horizontal and vertical directions; and
    a plurality of nozzles on each load cup configured to spray liquid onto one or more surfaces of the work pieces.

16. The mechanism of claim 15, wherein the liquid comprises one or more of deionized (DI) water, polishing slurry, acids, bases, and solvents.

17. The mechanism of claim 15, wherein the plurality of nozzles are configured to keep the one or more surfaces of the work pieces wet and to prevent ambient air from interacting with the one or more surfaces during the transfer.

18. The mechanism of claim 1, wherein each of the plurality of load cups comprises a self-centering mechanism for aligning the load cup relative to the process station.

19. The mechanism of claim 1, wherein each of the plurality of load cups is configured to support the work pieces by contacting an edge area of the work pieces that extends less than about 1 mm from the edges of the work pieces.

20. The mechanism of claim 1, further comprising a labyrinth moisture cover comprising aluminum non-contact seals.

21. The mechanism of claim 1, wherein the one or more sensors comprise one or more absolute encoders.

22. The mechanism of claim 1, wherein each of the plurality of load cups comprises a set of guide fingers having beveled edges configured to center the work pieces on the load cup.

23. A work piece processing apparatus comprising:
    (a) a plurality of process stations; and
    (b) a transfer load cup mechanism comprising:
        two or more independently movable load cups;
        a plurality of directional motors to move the load cups in a horizontal direction and a vertical direction;
        a plurality of rotational motors to pivot the load cups independently in an angular direction;
        one or more sensors to read the relative or absolute angular, horizontal and vertical positions of each load cup; and
        a controller capable of executing a set of instructions,
    wherein the transfer load cup mechanism is configured to move the load cups in rotational, horizontal, and vertical directions, and
    wherein each load cup is configurable to load and unload a work piece to and from the plurality of process stations.

24. The apparatus of claim 23, wherein each load cup is further configurable to transfer a work piece between the plurality of process stations.

25. The apparatus of claim 23, wherein the plurality of process stations comprises CMP, ECMP, grinding, lapping, buffing, electroplating, electroless plating, etching, cleaning, rinsing or drying stations.

26. The apparatus of claim 23, wherein the plurality of process stations comprises CMP stations.

27. A load cup mechanism associated with a process station comprising:
- two or more load cups configured to move independently; and
- a plurality of directional motors to move the load cups in a horizontal direction and a vertical direction;
- a plurality of rotational motors to pivot the load cups independently in an angular direction;
- one or more sensors to read the relative or absolute angular, horizontal and vertical positions of each load cup; and
- a controller capable of executing a set of instructions,
- wherein the mechanism is configured to move the load cups in rotational, horizontal, and vertical directions, and
- wherein the mechanism is configured to unload a processed work piece from the station with a first load cup of the two or more load cups and load an unprocessed work piece onto the process station with a second load cup of the two or more load cups.

28. The load cup mechanism of claim 27, wherein the process station is a CMP, ECMP, grinding, lapping, buffing, electroplating, electroless plating, etching, cleaning, rinsing or drying station.

29. The load cup mechanism of claim 27, wherein the process station is a CMP station.

* * * * *